United States Patent
Moon et al.

(10) Patent No.: US 10,008,641 B2
(45) Date of Patent: Jun. 26, 2018

(54) PHOSPHOR COMPOSITION AND LIGHT EMITTING DEVICE PACKAGE HAVING THE SAME

(71) Applicant: LG INNOTEK CO., LTD., Seoul (KR)

(72) Inventors: Ji Wook Moon, Seoul (KR); Hyun Goo Kang, Seoul (KR); Ji Hye Kim, Seoul (KR); Sun Young Park, Seoul (KR); Ki Ho Hong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days. days.

(21) Appl. No.: 15/390,980

(22) Filed: Dec. 27, 2016

(65) Prior Publication Data

US 2017/0110632 A1 Apr. 20, 2017

Related U.S. Application Data

(63) Continuation of application No. 14/081,404, filed on Nov. 15, 2013.

(30) Foreign Application Priority Data

Nov. 16, 2012 (KR) .................. 10-2012-0129971
Nov. 16, 2012 (KR) .................. 10-2012-0129972

(51) Int. Cl.
*H01L 33/00* (2010.01)
*H01L 33/50* (2010.01)
(Continued)

(52) U.S. Cl.
CPC .......... *H01L 33/502* (2013.01); *C09K 11/778* (2013.01); *C09K 11/7774* (2013.01); *H01L 33/38* (2013.01); *H01L 33/56* (2013.01)

(58) Field of Classification Search
CPC .............. C09K 11/778; C09K 11/7774; F21Y 2115/10; H01L 33/502; H01L 2224/48247;
(Continued)

(56) References Cited

U.S. PATENT DOCUMENTS 5,998,925 A 12/1999 Shimizu et al.
6,066,861 A 5/2000 Hohn et al.
(Continued)

FOREIGN PATENT DOCUMENTS

CN 1482208 A 3/2004
CN 1558454 A 12/2004
(Continued)

OTHER PUBLICATIONS

Bajaj et al., "Effects of Doping Trivalent Ions in Bismuth Borate Glasses," Journal of American Ceramic Society, vol. 92, No. 5, pp. 1036-1041, May 1, 2009.
(Continued)

*Primary Examiner* — A. Sefer
(74) *Attorney, Agent, or Firm* — Birch, Stewart, Kolasch & Birch, LLP (57) ABSTRACT

Disclosed are a phosphor composition and a light emitting apparatus including the same. The phosphor composition has a compositional formula of $A_zC_xO_{12}$:RE, wherein the z is $0 \le z \le 3$, the x is $0 \le x \le 5$, the A includes at least one selected from the group consisting of Y, Sc, Gd and Lu, the C includes at least one selected from the group consisting of B, Al and Ga, and the RE includes at least one selected from the group consisting of Eu, Ce, Sm, Yb, Dy, Gd, Tm and Lu. The light emitting apparatus includes the phosphor composition.

5 Claims, 5 Drawing Sheets

(51) Int. Cl.
  *C09K 11/77* (2006.01)
  *H01L 33/38* (2010.01)
  *H01L 33/56* (2010.01)

(58) Field of Classification Search
  CPC . H01L 2224/48257; H01L 2224/48091; H01L 2224/00014; F21K 9/232
  See application file for complete search history.

(56) References Cited

U.S. PATENT DOCUMENTS

| | | | |
|---|---|---|---|
| 6,409,938 | B1 | 6/2002 | Comanzo |
| 2002/0180338 | A1 | 12/2002 | Wang et al. |
| 2008/0017875 | A1 | 1/2008 | Lee et al. |
| 2008/0138268 | A1 | 6/2008 | Tao et al. |
| 2008/0191234 | A1 | 8/2008 | Kang et al. |
| 2009/0267485 | A1 | 10/2009 | Nagatomi et al. |
| 2010/0219746 | A1 | 9/2010 | Murazaki et al. |
| 2011/0050086 | A1* | 3/2011 | Liu .................. C09K 11/7734 313/487 |
| 2011/0279022 | A1 | 11/2011 | Winkler et al. |
| 2012/0229019 | A1* | 9/2012 | Liu .................. C09K 11/0883 313/504 |
| 2015/0061489 | A1 | 3/2015 | Gu et al. |

FOREIGN PATENT DOCUMENTS

| | | |
|---|---|---|
| CN | 1807547 A | 7/2006 |
| CN | 100999662 A | 7/2007 |
| CN | 101113333 A | 1/2008 |
| EP | 1911826 A1 | 4/2008 |
| JP | 2000-265169 A | 9/2000 |
| JP | 2006-233158 A | 9/2006 |
| WO | WO 2007/037059 A1 | 4/2007 |

OTHER PUBLICATIONS

Dotsenko et al., "Luminescence properties and electronic structure of Sm3+-doped YAl3B4O12," Journal of Materials Science, vol. 45, No. 6, pp. 1469-1472, Dec. 22, 2009.

Emme, et al., "Associating Borate and Silicate Chemistry by Extreme Conditions: High-Pressure Synthesis, Crystal Struture, and Properties of the New Borates RE3B5O12 (Re=Er—Lu)," Chemistry of Materials, vol. 17, pp. 2707-2715, Apr. 22, 2005.

Lakshmanan et al., "Synthesis, photoluminescence and thermal quenching of YAG:Ce phosphor for white light emitting diodes", Indian Journal of Pure & Applied Physics, vol. 49, May 2011, pp. 303-307.

Wang et al., "Synthesis and Properties of Well-dispersive and Spherical Yag:Ce3+ Phosphors, Chinese Journal of Materials Research", vol. 26, No. 4, Aug. 2012, pp. 414-417.

Yin et al., "Effect of different doped elements on visible light absorption and ultraviolent light emission on Er3+:Y3Al5O12," Journal of Luminescence, vol. 132, No. 11, pp. 3010-3018, Jun. 26, 2012.

* cited by examiner

PHOSPHOR COMPOSITION AND LIGHT EMITTING DEVICE PACKAGE HAVING THE SAME

CROSS-REFERENCE TO RELATED APPLICATIONS

This application is a Continuation of copending U.S. application Ser. No. 14/081,404 filed on Nov. 15, 2013, which claims priority under 35 U.S.C. § 119(a) to Korean Patent Application Nos. 10-2012-0129971 and 10-2012-0129972 filed on Nov. 16, 2012, each of which is hereby incorporated by reference in its entirety.

BACKGROUND

The embodiment relates to a phosphor composition and a light emitting apparatus including the same. The light emitting apparatus may include a light emitting device package, a lighting unit or a backlight unit.

An LED (Light Emitting Device) is a device having a property of converting electrical energy into light energy. For example, the LED may represent various colors by adjusting the compositional ratio of compound semiconductors.

For instance, a nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been commercialized and extensively used.

An LED of emitting white color light, which employs a secondary light source of emitting light by coating phosphor, is generally implemented through a scheme of coating YAG:Ce phosphor of generating yellow color light on a blue LED.

However, according to the scheme described above, due to quantum deficits and reradiation efficiency caused by secondary light, the efficiency is reduced and the color rendering is not easy.

Thus, since a blue LED is combined with yellow phosphor in a white LED backlight of the related art, the white LED backlight lacks of green and red components, so that colors are unnaturally represented. For this reason, the white LED backlight has been limitedly applied to a display of a portable phone or a laptop computer. Nevertheless, the white LED backlight according to the related art has been extensively used because the white LED backlight is easily driven and inexpensive.

Generally, it is well known in the art that the phosphor material may include a silicate, a phosphate, an aluminate, or a sulfide and a transition metal or a rare-earth metal is used at the center of light emission. For example, although silicate phosphor has been used for a backlight unit or a lighting device, the silicate phosphor is weak to moisture so the reliability of the silicate phosphor is inferior to any other phosphors.

Meanwhile, although a phosphor for a white LED, which is excited by an excitation source having high energy such as ultraviolet light or blue light to emit visible light, has been mainly developed, if the phosphor according to the related art is exposed to the excitation source, the luminance of the phosphor is reduced.

SUMMARY

The embodiment provides a phosphor composition having improved reliability and a high luminance, and a light emitting apparatus having the same.

Further, the embodiment provides a phosphor composition having high light emission intensity and a light emitting apparatus having the same.

The embodiment provides a yellow phosphor having a new composition and a light emitting apparatus having the same.

Further, the embodiment provides a phosphor composition having improved reliability and a high luminance, and a light emitting apparatus having the same.

In addition, the embodiment provides a phosphor composition having high light emission intensity and a light emitting apparatus having the same.

A phosphor composition according to the embodiment is expressed as a compositional formula of $A_zC_xO_{12}$:RE ($0<z\leq0.5$), wherein the A may include at least one selected from the group consisting of Y, Sc, Gd and Lu, the C may include at least one selected from the group consisting of Al and Ga, and the RE may include at least one selected from the group consisting of Eu, Ce, Sm, Yb, Dy, Gd, Tm and Lu.

A phosphor composition according to the embodiment is expressed as a compositional formula of $A_{3-z}C_5O_{12}$:$RE_z$ ($0<z\leq0.5$), wherein the A may include at least one selected from the group consisting of Y, Sc, Gd and Lu, the C may include at least one selected from the group consisting of Al and Ga, the RE may include at least one selected from the group consisting of Eu, Ce, Sm, Yb, Dy, Gd, Tm and Lu, and the compositional formula of $A_{3-z}C_5O_{12}$:$RE_z$ may include a compositional formula of $(Y, Gd)_{3-z}(B,Al)_5O_{12}$:Ce.

A phosphor composition according to the embodiment is expressed as a compositional formula of $A_{3-z}C_5O_{12}$:$RE_z$ ($0<z\leq0.5$), wherein the A may include at least one selected from the group consisting of Y, Sc, Gd and Lu, the C may include at least one selected from the group consisting of B (Boron), Al and Ga, the RE may include at least one selected from the group consisting of Eu, Ce, Sm, Yb, Dy, Gd, Tm and Lu, and the compositional formula of $A_{3-z}C_5O_{12}$:$RE_z$ may include a compositional formula of $(Gd_{3-y-z}Y_y)B_5O_{12}$:$Ce_z$ ($0\leq y\leq2$).

A light emitting device package according to the embodiment includes a body; first and second electrode layers on the body; a light emitting chip electrically connected to the first and second electrode layers; and a molding member including a phosphor composition on a light emitting chip, wherein the phosphor composition includes a compositional formula of $A_zC_xO_{12}$:RE, the z is $0\leq z\leq3$ and the x is $0\leq x\leq5$, the A includes at least one selected from the group consisting of Y, Sc, Gd and Lu, the C includes at least one selected from the group consisting of B (Boron), Al and Ga, the RE is at least one selected from the group consisting of Eu, Ce, Sm, Yb, Dy, Gd, Tm and Lu, and the phosphor composition emits yellow light.

DETAILED DESCRIPTION OF THE EMBODIMENTS

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

(Embodiment)

Figure 1:
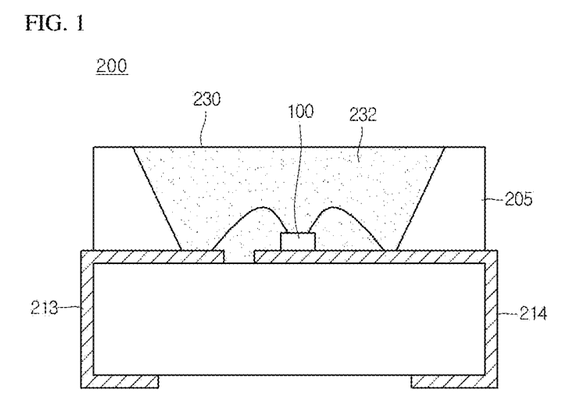
FIG. 1 is a sectional view showing a light emitting device package including a phosphor composition according to the embodiment.

FIG. 1 is a sectional view showing a light emitting device package 200 including a phosphor composition according to the first embodiment. The package structure according to the first embodiment is not limited thereto, and is applicable to a two cup package type of a package.

The light emitting device package 200 may include a package body 205, a light emitting device chip 100 on the package body 205 and a molding member 230 including a phosphor composition 232 on the light emitting device chip 100.

The phosphor composition 232 according to the first embodiment is expressed as a compositional formula of $A_{3-z}C_5O_{12}:RE_z(0<z\leq0.5)$, wherein the A may include at least one selected from the group consisting of Y, Sc, Gd and Lu, the C may include at least one selected from the group consisting of B (Boron), Al and Ga, and the RE may include at least one selected from the group consisting of Eu, Ce, Sm, Yb, Dy, Gd, Tm and Lu.

The phosphor composition 232 according to the first embodiment may include a formula of $Y_3(B_{5-x}Al_x)O_{12}:Ce$ $(0\leq x<5)$.

In addition, the phosphor composition 232 according to the second embodiment may include a formula of $(Y, Gd)_{3-z}(B,Al)_5O_{12}:Ce_z$.

The phosphor compositions 232 according to the first and second embodiments may have a light emission wavelength in the range of 559 nm to 567 nm with respect to an excitation wavelength in the range of 420 nm to 500 nm.

The light emitting device package 200 according to the embodiment may include a package body 205, first and second electrode layers 213 and 214 mounted on the package body 205, a light emitting device chip 100 mounted on the package body 205 and electrically connected to the first and second electrode layers 213 and 214, and a molding member 230 surrounding the light emitting device chip 100.

The package body 205 may include a silicon material, a synthetic resin material or a metallic material. An inclined surface may be formed around the light emitting device chip 100.

The first and second electrode layers 213 and 214 are electrically separated from each other, and perform a function of supplying electric power to the light emitting device chip 100. In addition, the first and second electrode layers 213 and 214 reflect the light generated from the light emitting device chip 100 so that the light efficiency may be increased, and may dissipate the heat generated from the light emitting device 10 to an outside.

The light emitting device chip 100 may be applied to a lateral-type light emitting device, but the embodiment is not limited thereto. The light emitting device chip 100 may be applied to a vertical-type light emitting device or a flip-chip-type light emitting device.

The light emitting device chip 100 may be formed of a nitride semiconductor. For example, the light emitting device chip 100 may include GaN, GaAs, GaAsP or GaP.

The light emitting device chip 100 may include a light emitting structure including a first conductive semiconductor layer (not shown), an active layer (not shown) and a second conductive semiconductor layer (not shown).

According to the embodiment, the first conductive semiconductor layer may include an N type semiconductor layer and the second conductive semiconductor layer may include a P type semiconductor layer, but the embodiment is not limited thereto. In addition, a semiconductor layer, such as an N type semiconductor layer (not shown) having polarity opposite to that of the second conductive semiconductor layer, may be formed on the second conductive semiconductor layer. Thus, the light emitting structure 110 may include one of an N-P junction structure, a P-N junction structure, an N-P-N junction structure, and a P-N-P junction structure.

The light emitting device chip 100 may be disposed on the package body 205, or may be disposed on the first or second electrode layer 213 or 214.

The light emitting device chip 100 may be electrically connected to the first and/or second electrode layer 213 and/or 214 through one of a wire scheme, a flip-chip scheme and a die bonding scheme. Although it is described in the embodiment that the light emitting device chip 100 is electrically connected to the first electrode layer 213 through a first wire and to the second electrode layer 214 through a second wire, the embodiment is not limited thereto.

The molding member 230 surrounds the light emitting device chip 100 to protect the light emitting device chip 100. The phosphor composition 232 is included in the molding member 230 so that the wavelength of light emitted from the light emitting device chip 100 may be changed.

Since the phosphor composition 232 according to the embodiment has a light emitting region in the yellow region, so that the phosphor composition 232 may be applied for implementing a white LED.

For example, the phosphor composition 232 may have an excitation wavelength in the range of 420 nm to 500 nm and a yellow-light emission wavelength in the range of 559 nm to 567 nm by the absorption region.

The yellow phosphor composition 232 according to the embodiment is applicable and utilizable for a UV-LED and a blue LED.

For example, a conventional scheme of implementing a white LED using a blue LED chip includes a scheme of coating green and red phosphor compositions on a blue LED chip, a yellow phosphor composition and a blue LED chip and a scheme of coating green, red and yellow colors on a blue LED chip, where the phosphor composition of the embodiment signifies a phosphor composition that emits a yellow light and is used to implement a white LED.

According to the embodiment, a white LED may be implemented by applying green, red and blue phosphor compositions to a UV-chip, and the color rendering index may be improved by additionally coating the yellow phosphor composition to the white LED.

When the white LED is implemented by using the phosphor composition 232 of the embodiment, the white LED is usable in a field of mobile, vehicle, lamp, backlight unit or medicine.

Hereinafter, the features of the embodiment will be described in more detail with reference to the process of fabricating a phosphor composition according to the embodiment.

A phosphor composition according to the first embodiment is expressed as a compositional formula of $A_{3-z}C_5O_{12}$:$RE_z$ ($0<z\leq0.5$), where the A may include at least one of selected from the group consisting Y, Sc, Gd and Lu, the C may include at least one selected from the group consisting of B (Boron), Al and Ga, and the RE may include at least one selected from the group consisting of Eu, Ce, Sm, Yb, Dy, Gd, Tm and Lu.

For example, the phosphor composition 232 of the first embodiment may include the compositional formula of $Y_3(B_{5-x}Al_x)O_{12}$:Ce ($0\leq x<5$).

The phosphor composition 232 according to the embodiment has an advantage of being easily fabricated through a solid-state reaction method by using a stable starting material. For example, after raw materials of $Y_2O_3$, $Al_2O_3$, $B_2O_3$, $CeO_2$ and $NH_4Cl$ are weighed according to the composition ratio of $Y_3B_{5-x}Al_xO_{12}$:Ce, the raw materials are mixed in an agate mortar with solvent. In this case, the raw materials may be mixed into the composition according to the variation of the ratio of B to Al in the range of $0\leq x<5$.

In addition, the phosphor composition 232 according to the second embodiment may include the compositional formula of $(Y, Gd)_{3-z}(B,Al)_5O_{12}$:$Ce_z$. For example, materials may be mixed according to a variation of the ratio of Ce in the basic composition of $(Y, Gd)_{3-z}(B,Al)_5O_{12}$:$Ce_z$. The z may be $0.1\leq z\leq 0.3$, but the embodiment is not limited thereto.

The synthesis atmosphere of the phosphor composition 232 has the condition of a gas flow in the range of 400 cc to 2,000 cc per minute and the synthesis temperature in the range of about 1300° C. to about 1500° C. The reductive gas may include $H_2$, $N_2$, and $NH_3$. In this case, the phosphor composition 232 may be synthesized by changing the ratio of $H_2/N_2$ mixing gas in the range of 5%/95% to 20%/80%.

For example, the phosphor composition 232 according to the embodiment is synthesized under the condition in which the reductive gas has a content of 20% of $H_2$ and 80% of $N_2$, the gas flow is 1,000 cc/min for about six hours, and the temperature is about 1,400° C., but the embodiment is not limited thereto.

Then, the fired phosphor composition 232 may be dried after performing a ball milling process and a cleaning process using zirconia and a glass ball.

The particles of the phosphor composition 232 of the embodiment having the size of about 10 μm and irregular shapes may be identified based on SEM (Scanning Electron Microscopy) data and the components of the phosphor composition 232 may be identified through EDX (Energy Dispersive X-ray analyzer).

Figure 2:
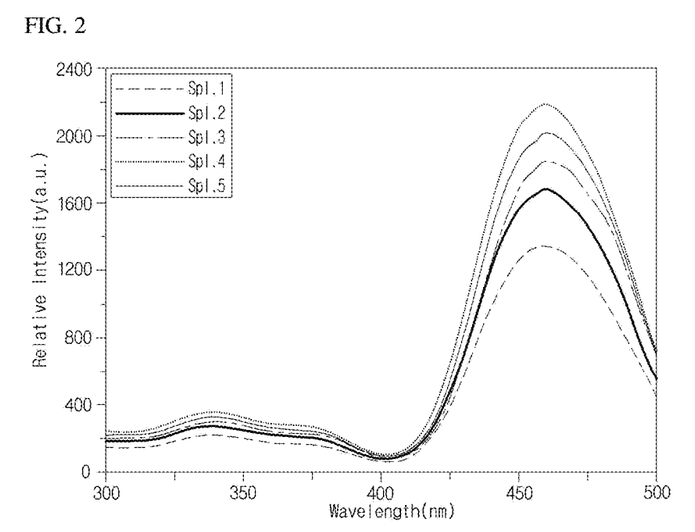
FIG. 2 is a graph showing excitation wavelength characteristic data according to the ratio of B to Al in the light emitting device including the phosphor composition of the embodiment.
Figure 3:
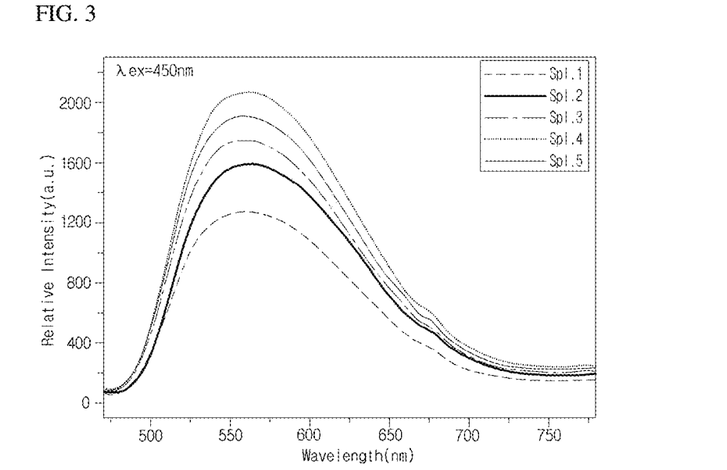
FIG. 3 is a graph showing light emission wavelength characteristic data according to the ratio of B to Al in the light emitting device including the phosphor composition of the embodiment.

As shown in FIGS. 2 and 3, the excitation light emission characteristic of the dried phosphor composition 232 may be analyzed through PL (Photoluminescence) analysis. In cases of $Y_3B_{5-x}Al_xO_{12}$:Ce and $(Y,Gd)_{3-z}(B,Al)_5O_{12}$:$Ce_z$ according to a condition change, it may be known that the phosphor composition 232 is a yellow phosphor composition 232 having a light emission wavelength in the range of 559 nm ~567 nm.

FIG. 2 is a graph showing excitation wavelength characteristic data according to the ratio of B to A in the light emitting device including the phosphor composition 232 according to the embodiment.

FIG. 3 is a graph showing light emission wavelength characteristic data according to the ratio of B to Al in the light emitting device including the phosphor composition 232 of the embodiment.

Table 1 shows characteristic experimental examples of the light emitting device including the phosphor composition 232 of the embodiment according to the ratio of B to Al.

TABLE 1

| Experimental example | Ratio of B to Al | Composition | Relative intensity | Center wavelength (mm) |
|---|---|---|---|---|
| Experimental example 1 (Spl 1) | B = 5, Al = 0 | $Y_3B_5O_{12}$:Ce | 100 | 560 |
| Experimental example 2 (Spl 2) | B = 4, Al = 1 | $Y_3B_4Al_1O_{12}$:Ce | 124.8 | 563 |
| Experimental example 3 (Spl 3) | B = 3, Al = 2 | $Y_3B_3Al_2O_{12}$:Ce | 137.5 | 559 |
| Experimental example 4 (Spl 4) | B = 2, Al = 3 | $Y_3B_2Al_3O_{12}$:Ce | 162.4 | 561 |
| Experimental example 5 (Spl 5) | B = 1, Al = 4 | $Y_3B_1Al_4O_{12}$:Ce | 150.1 | 560 |

According to the embodiment, when the compositional ratio x of Al in the compositional formula of $Y_3(B_{5-x}Al_x)O_{12}$:Ce is in the range of $1\leq x\leq 4$, the light emitting device has high reliability and shows an optimal light emission intensity due to its high luminance as compared with the composition of $Y_3B_5O_{12}$:Ce. For example, as shown in Table 1, it may be identified the highest light emission intensity is shown in the experimental example 4, but the embodiment is not limited thereto.

A phosphor composition 232 according to the third embodiment is expressed as a compositional formula of $A_{3-z}C_5O_{12}$:$RE_z$ ($0<z\leq0.5$), where the A may include at least one selected from the group consisting of Y, Sc, Gd and Lu, the C may include at least one selected from the group consisting of B (Boron), Al and Ga, and the RE may include at least one selected from the group consisting of Eu, Ce, Sm, Yb, Dy, Gd, Tm and Lu.

The phosphor composition 232 according to the third embodiment may include a compositional formula of $(Gd_{3-y-z}Y_y)B_5O_{12}$:$Ce_z$ ($0\leq y\leq 2$). The phosphor compositions 232 may have a light emission wavelength in the range of 559 nm to 567 nm with respect to an excitation wavelength in the range of 420 nm to 500 nm. For example, the phosphor composition 232 according to the first embodiment may include a compositional formula of $(Gd_{3-y-z}Y_y)B_5O_{12}:Ce_z$ (0<z≤0.5).

A phosphor composition 232 according to still another embodiment may include a compositional formula of $(Y, Gd)_{3-z}(B,Al)_5O_{12}:Ce_z$. For example, materials may be mixed according to a variation of the ratio of Ce in the basic composition of $(Y, Gd)_{3-z}(B,Al)_5O_{12}:Ce_z$. The z may be 0.1≤z≤0.3, but the embodiment is not limited thereto.

The phosphor composition 232 according to the embodiment has an advantage of being easily fabricated through a solid-state reaction method by using a stable starting material. For example, after raw materials of $Y_2O_3$, $Gd_2O_3$, $B_2O_3$, $CeO_2$ and $NH_4Cl$ are weighed according to the composition ratio of $(Gd_{3-y-z}Y_y)B_5O_{12}:Ce_z$, the raw materials are mixed in an agate mortar with solvent. In this case, the raw materials may be mixed into the composition according to the variation of the ratio of Y to Gd in the range of 0≤y<2.

The synthesis atmosphere of the phosphor composition 232 has the condition of a gas flow in the range of 400 cc to 2,000 cc per minute and the synthesis temperature in the range of about 1300° C. to about 1500° C. The reductive gas may include $H_2$, $N_2$, and $NH_3$. In this case, the phosphor composition 232 may be synthesized by changing the ratio of $H_2/N_2$ mixing gas in the range of 5%/95% to 20%/80%. For example, the phosphor composition 232 according to the embodiment is synthesized under the condition in which a reductive gas has a content of 20% of $H_2$ and 80% of $N_2$, the gas flow is 1,000 cc/min for about six hours, and the temperature is about 1,400° C., but the embodiment is not limited thereto.

Then, the fired phosphor composition 232 may be dried after performing a ball milling process and a cleaning process using zirconia and a glass ball.

The particles of the phosphor composition 232 of the embodiment having the size of about 10 μm and irregular shapes may be identified based on SEM (Scanning Electron Microscopy) data and the components of the phosphor composition 232 may be identified through EDX (Energy Dispersive X-ray analyzer).

Figure 4:
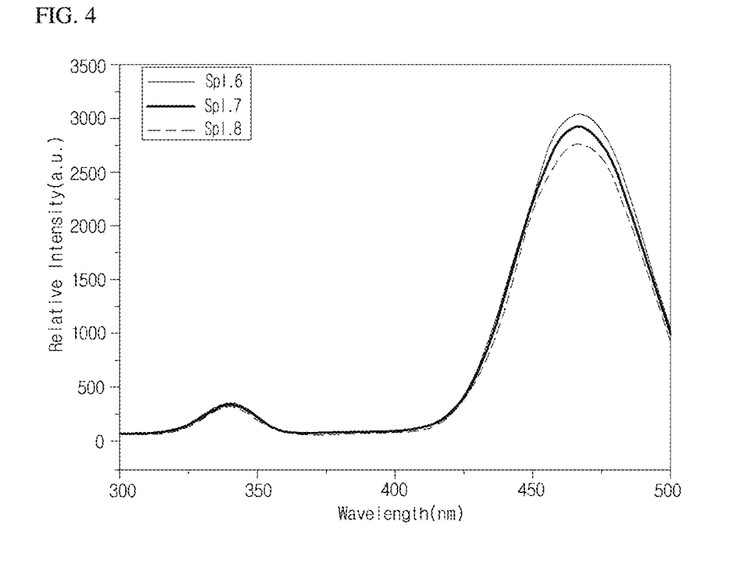
FIG. 4 is a graph showing excitation wavelength characteristic data according to the ratio of Y to Gd in the light emitting device including the phosphor composition according to the embodiment.
Figure 5:
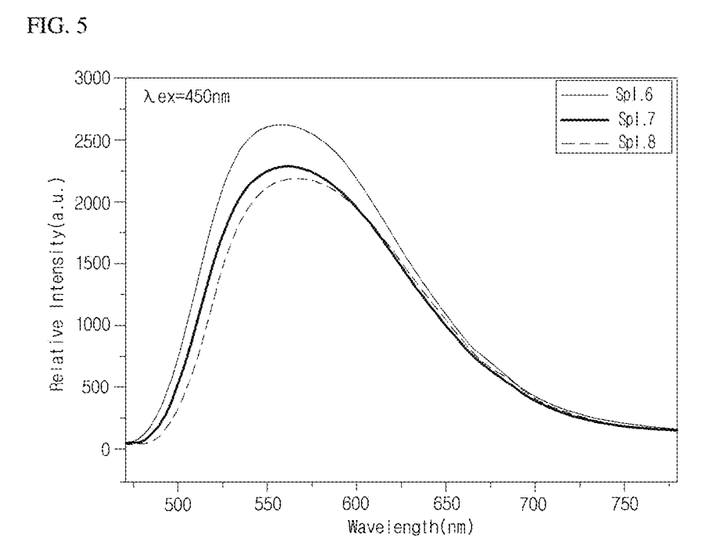
FIG. 5 is a graph showing light emission wavelength characteristic data according to the ratio of Y to Gd in the light emitting device including the phosphor composition of the embodiment.

As shown in FIGS. 4 and 5, the excitation light emission characteristic of the dried phosphor composition 232 may be analyzed through PL analysis. In cases of $(Gd_{3-y-z}Y_y)B_5O_{12}:Ce_z$ or $(Y,Gd)_{3-z}(B,Al)_5O_{12}:Ce_z$ according to a condition change, it may be known that the phosphor composition 232 is a yellow phosphor composition 232 having a light emission wavelength in the range of 559 nm ~567 nm.

FIG. 4 is a graph showing excitation wavelength characteristic data according to the ratio of Y to Gd in the light emitting device including the phosphor composition 232 according to the embodiment.

FIG. 5 is a graph showing light emission wavelength characteristic data according to the ratio of Y to Gd in the light emitting device including the phosphor composition 232 of the embodiment.

TABLE 2

| Experimental example | Ratio of Y to Gd | Composition | Relative intensity | Center wavelength (nm) |
|---|---|---|---|---|
| Experimental example 6 (Spl 6) | Y = 0, Gd = 3 | $Gd_3B_5O_{12}:Ce$ | 100 | 559 |
| Experimental example 7 (Spl 7) | Y = 1, Gd = 2 | $Y_1Gd_2B_5O_{12}:Ce$ | 87.2 | 562 |
| Experimental example 8 (Spl 8) | Y = 2, Gd = 1 | $Y_2Gd_1B_5O_{12}:Ce$ | 83.4 | 567 |

Table 2 shows characteristic experimental examples of the light emitting device including the phosphor composition 232 of the embodiment according to the ratio of Y to Gd.

According to the embodiment, when the compositional ratio y of Y in the compositional formula of $(Gd_{3-y-z}Y_y)B_5O_{12}:Ce_z$ is in the range of 0≤y≤2, the light emitting device has high reliability and shows an optimal light emission intensity due to its high luminance as compared with the related art.

As shown in FIG. 5, according to the embodiment, a new yellow phosphor composition of emitting yellow light, which has not been proposed in the related art, may be provided by including the composition formula of $(Gd_{3-y-z}Y_y)B_5O_{12}:Ce_z$ or $Gd)_{3-z}(B,Al)_5O_{12}:Ce_z$.

Figure 6:
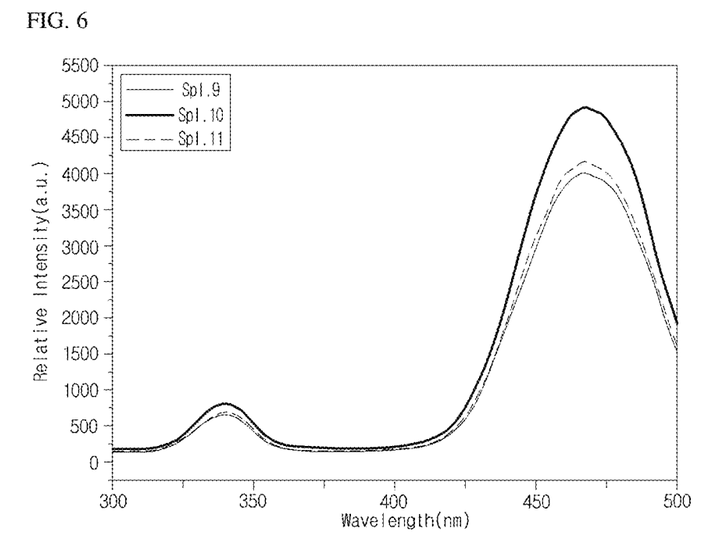
FIG. 6 is a graph showing excitation wavelength characteristic data according to the ratio of Ce in the light emitting device including the phosphor composition according to the embodiment.

FIG. 6 is a graph showing excitation wavelength characteristic data according to the ratio of Ce in the light emitting device including the phosphor composition 232 according to the embodiment.

Figure 7:
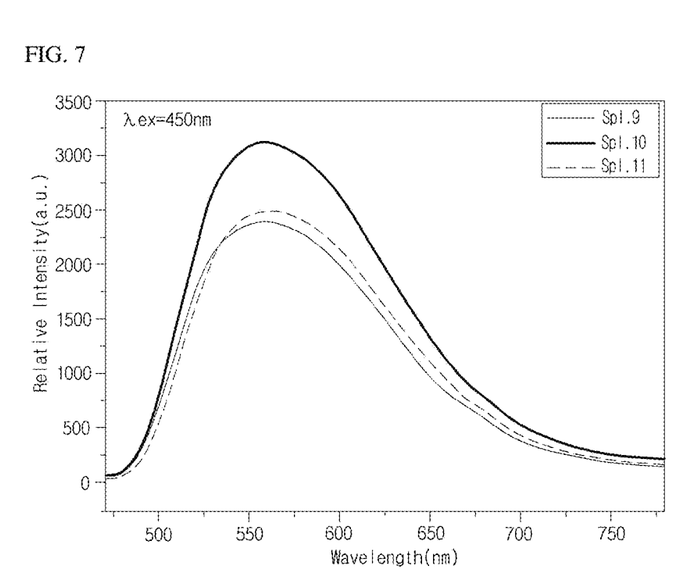
FIG. 7 is a graph showing light emission wavelength characteristic data according to the ratio of Ce in the light emitting device including the phosphor composition of the embodiment.

FIG. 7 is a graph showing light emission wavelength characteristic data according to the ratio of Ce in the light emitting device including the phosphor composition 232 of the embodiment.

TABLE 3

| Experimental example | Ratio of Ce | Composition | Relative intensity | Center wavelength (mm) |
|---|---|---|---|---|
| Experimental example 9 (Spl 9) | 0.1 | $(Y, Gd)_3(B,Al)_5O_{12}:Ce_{0.1}$ | 100 | 559 |
| Experimental example 10 (Spl 10) | 0.2 | $(Y, Gd)_3(B,Al)_5O_{12}:Ce_{0.2}$ | 129.9 | 560 |
| Experimental example 11 (Spl 11) | 0.3 | $(Y, Gd)_3(B,Al)_5O_{12}:Ce_{0.3}$ | 103.9 | 564 |

Table 3 shows characteristic experimental examples of the light emitting device including the phosphor composition 232 of the embodiment according to the ratio of Ce.

According to the embodiment, when the compositional ratio z of RE in the compositional formula of $A_{3-z}C_5O_{12}:RE_z$ is in the range of 0.1≤z≤0.3, the light emitting device shows a high light emission intensity as compared with the related art. Specifically, as the results shown in Table 2, when the ratio of Ce is 0.2 (Experimental example 10), it has been identified that the maximum light emission intensity is outputted, but the embodiment is not limited to experimental example 10.

Figure 8:
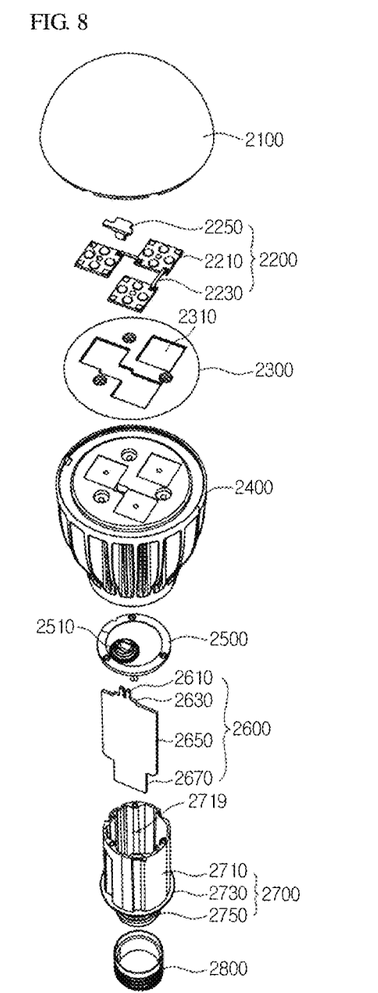
FIG. 8 is an exploded perspective view showing a lighting device having a light emitting device according to the embodiment.

FIG. 8 is an exploded perspective view showing a lighting device having the light emitting device according to the embodiment.

Referring to FIG. 8, the lighting system according to the embodiment may include a cover 2100, a light source module 2200, a radiator 2400, a power supply part 2600, an inner case 2700, and a socket 2800. The lighting device according to the embodiment may further include at least one of a member 2300 and a holder 2500. The light source module 2200 may include the light emitting device according to the embodiment.

For example, the cover 2100 may have a blub shape, a hemisphere shape, a partially-open hollow shape. The cover 2100 may be optically coupled with the light source module 2200. For example, the cover 2100 may diffuse, scatter, or excite light provided from the light source module. The cover 2100 may be a type of optical member. The cover 2100 may be coupled with the radiator 2400. The cover 2100 may include a coupling part which is coupled with the radiator 2400.

The cover 2100 may include an inner surface coated with a milk-white paint. The milk-white paint may include a diffusion material to diffuse light. The cover 2100 may have the inner surface of which surface roughness is greater than that of the outer surface thereof. The surface roughness is provided for the purpose of sufficiently scattering and diffusing the light from the light source module 2200.

For example, a material of the cover 2100 may include glass, plastic, polypropylene (PP), polyethylene (PE), and polycarbonate (PC). The polycarbonate (PC) has the superior light resistance, heat resistance and strength among the above materials. The cover 2100 may be transparent so that a user may view the light source module 2200 from the outside, or opaque. The cover 2100 may be formed through a blow molding scheme.

The light source module 2200 may be disposed at one surface of the radiator 2400. Accordingly, the heat from the light source module 2200 is transferred to the radiator 2400. The light source module 2200 may include a light source 2210, a connection plate 2230, and a connector 2250.

The member 2300 is disposed at a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white paint. The member 2300 again reflects light, which is reflected by the inner surface of the cover 2100 and is returned to the direction of the light source module 2200, to the direction of the cover 2100. Accordingly, the light efficiency of the lighting device according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be configured by an insulating material, thereby preventing the connection plate 2230 from being electrically shorted with the radiator 2400. The radiator 2400 receives and radiates heats from the light source module 2200 and the power supply part 2600.

The holder 2500 covers a receiving groove 2719 of an insulating part 2710 of an inner case 2700. Accordingly, the power supply part 2600 received in the insulating part 2710 of the inner case 2700 is closed. The holder 2500 includes a guide protrusion 2510. The guide protrusion 2510 has a hole through a protrusion of the power supply part 2600.

The power supply part 2600 processes or converts an electric signal received from the outside and provides the processed or converted electric signal to the light source module 2200. The power supply part 2600 is received in a receiving groove 2719 of the inner case 2700, and is closed inside the inner case 2700 by the holder 2500.

The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed above one surface of the base 2650. For example, the components may include a DC converter converting AC power provided from an external power supply into DC power, a driving chip controlling driving of the light source module 2200, and an electrostatic discharge (ESD) protection device protecting the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+ electric wire" and a "− electric wire" are electrically connected to the extension part 2670 and second terminals of the "+ electric wire" and the "− electric wire" may be electrically connected to the socket 2800.

The inner case 2700 may include a molding part therein together with the power supply part 2600. The molding part is prepared by hardening molding liquid, and the power supply part 2600 may be fixed inside the inner case 2700 by the molding part.

According to the embodiment, a phosphor composition having improved reliability and a high luminance, and a light emitting apparatus having the same may be provided.

In addition, the embodiment may provide a phosphor composition having high light emission intensity and a light emitting apparatus having the same.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A phosphor composition having a compositional formula of $(Gd_{3-y-z}Y_y)B_5O_{12}:RE_z$,
wherein the z is $0 \leq z \leq 0.5$ and the y is $0 < y \leq 2$, and
wherein the RE includes at least one selected from the group consisting of Eu, Ce, Sm, Yb, Dy, Gd, Tm and Lu.

2. A light emitting device package comprising:
a body;
first and second electrode layers on the body;
a light emitting chip electrically connected to the first and second electrode layers; and
a molding member including a phosphor composition on the light emitting chip,
wherein the phosphor composition is as claimed in claim 1.

3. The light emitting device package of claim 2, wherein the light emitting chip includes a UV LED chip or a blue LED chip.

4. The phosphor composition of claim 1, wherein $0.1 \leq z \leq 0.3$.

5. The phosphor composition of claim 1, wherein the phosphor composition has a light emission wavelength in a range of 559 nm to 567 nm with respect to an excitation wavelength in a range of 420 nm to 500 nm.

\* \* \* \* \*